US007132893B2

(12) United States Patent
Eck et al.

(10) Patent No.: US 7,132,893 B2
(45) Date of Patent: Nov. 7, 2006

(54) SELECTABLE GAIN AMPLIFIER

(75) Inventors: Arthur Bruce Eck, Gilbert, AZ (US);
Ezana H. Aberra, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 76 days.

(21) Appl. No.: 10/841,744

(22) Filed: May 7, 2004

(65) Prior Publication Data
US 2005/0248409 A1 Nov. 10, 2005

(51) Int. Cl.
*H03F 3/14* (2006.01)
*H03F 1/36* (2006.01)

(52) U.S. Cl. .................. 330/307; 330/86; 330/278
(58) Field of Classification Search ............... None
See application file for complete search history.

(56) References Cited
U.S. PATENT DOCUMENTS 5,721,513 A * 2/1998 Yuasa ..................... 330/282
6,020,785 A * 2/2000 Allen et al. ............. 330/129
6,693,490 B1 * 2/2004 Manapragada et al. .. 330/282
6,847,904 B1 * 1/2005 Blake et al. ............. 330/278
6,952,132 B1 * 10/2005 Bhattacharjee et al. ... 330/278

\* cited by examiner

*Primary Examiner*—Khanh Van Nguyen
(74) *Attorney, Agent, or Firm*—Baker Botts L.L.P.

(57) ABSTRACT

A selectable gain amplifier in a standard integrated circuit package configuration comprises an amplifier having an analog input, an output and a control input for selecting one of two or three possible gains for the operational amplifier. A plurality of selectable gain amplifiers may be in a standard integrated circuit package configuration, each having a gain control input for selection of the two or three possible gains. The gain control input replaces an inverting input of a standard operational amplifier and the analog input is the a non-inverting input of the operational amplifier or visa-versa. All other characteristics of the selectable gain amplifier may be the same or similar to a standard operational amplifier. The selectable gain amplifier(s) may be packaged in industry standard integrated circuit packages having standard pin-outs so that they may be compatible as replacement analog amplifiers for existing technology operational amplifier integrated circuit packages.

39 Claims, 9 Drawing Sheets

SELECTABLE GAIN AMPLIFIER

FIELD OF THE INVENTION

The present invention relates generally to semiconductor integrated circuits, and more particularly to gain selection in semiconductor integrated circuit operational amplifiers.

BACKGROUND OF THE INVENTION TECHNOLOGY

Modern electronic equipment uses analog semiconductor integrated circuits for operation thereof. The analog semiconductor integrated circuits receive analog inputs from various sources, e.g., analog voltage signals such as from sensors, a current-to-voltage converter (resistor), etc., and/or may output analog voltage levels, e.g., analog meter, audio and video applications, servo control, etc. Typically, analog signals must be amplified and/or isolated from an input or an output, and may require impedance transformations from a very high impedance source to driving a low impedance load. Analog operational amplifiers are well suited to perform the aforementioned functions since they are low cost and easily configured for a desired gain with just a few basic parts. Operational amplifiers have become so popular that they are available in many of the standard integrated circuit packages with a substantially uniform pin-out for each of these integrated circuit packages.

Generally, the voltage gain of an operation amplifier may be defined by one or two resistors. So an electronic system using analog input and/or output signals and requiring analog amplification, isolation and/or impedance matching may comprise a plurality of operational amplifiers and gain setting resistors associated therewith. Operational amplifiers in integrated circuit packages are space efficient when used in high density printed circuit boards, however, the gain setting resistors, even the surface mount style, are generally discrete components and take up a lot more circuit board space for what they contribute to the overall electronic system.

Programmable gain operational amplifiers are available that do not require any external gain setting resistors, however, these programmable gain operational amplifiers are generally more complex and are designed for more sophisticated and complex applications than a standard operational amplifier. In addition, the programmable gain operational amplifiers may be packaged and have different pin-outs, e.g., additional pins for gain control, then standard operational amplifiers, and thereby cannot be used as direct replacements in existing electronic circuit board designs. The programmable gain operational amplifiers are generally more expensive than standard operational amplifiers because of their more complex circuitry and lower manufacturing volume compared to the costs and volumes of standard operational amplifiers.

Therefore, what is needed is an analog amplifier in an integrated circuit package that does not require gain setting resistors, has gain selection options and is compatible with existing printed circuit board layouts and integrated circuit package pin-outs.

SUMMARY OF THE INVENTION

The invention overcomes the above-identified problems as well as other shortcomings and deficiencies of existing technologies by providing an analog amplifier in an integrated circuit package that does not require gain setting resistors, has gain selection options and is compatible with existing printed circuit board layouts and integrated circuit package pin-outs.

According to embodiments of the invention, a selectable gain amplifier in a standard integrated circuit package configuration comprises an analog amplifier having an analog input, an output and a gain control input for selecting one of two or three possible gains for the operational amplifier. A plurality of selectable gain amplifiers in a standard integrated circuit package configuration, each having a gain control input for selection of the two or three possible gains, is also contemplated herein. The gain control input may replace an inverting input of a standard operational amplifier and the analog input may be a non-inverting input of the operational amplifier. All other characteristics of the selectable gain amplifier may be the same or similar to a standard operational amplifier. It is also contemplated herein that the inverting input may be used as the analog input and what would have been the non-inverting input used as a gain control input. Up to three gain blocks may be selected through the gain control input by applying a positive supply voltage (e.g., logic level high), a common or ground supply voltage (e.g., logic level low) and no connection or a high impedance connection (e.g., floating input). One of these three input levels may be selected by a hardwired jumper, printed circuit board land, absence of either, or by a tri-state output from a digital logic circuit, e.g., each of the three gains may be selected dynamically through software and/or firmware from an output of a digital logic device or circuit, e.g., a digital processor, microcontroller, microprocessor, application specific integrated circuit (ASIC), programmable logic array (PLA), digital signal processor (DSP), and the like. It is also contemplated and within the scope of the invention that one of two gains may be selected by using a jumper from the gain control input to a common or power supply voltage (e.g., logic level low or logic level high, respectively), or a jumper may be used from either a common or a power supply voltage for a first gain, and no jumper, e.g., gain control input unconnected for a second gain. The analog amplifier may be an operational amplifier, an operational transconductance amplifier (OTA), and the like.

A technical advantage of the invention is a replacement device for existing analog circuit designs. Another technical advantage is gain selection by a digital device. Still another advantage is more compact designs of electronic equipment requiring analog circuits. Another advantage is selection of one of three gains with a single control input. Still another advantage is selection of two gains with a single control input.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein.

Figure 1:
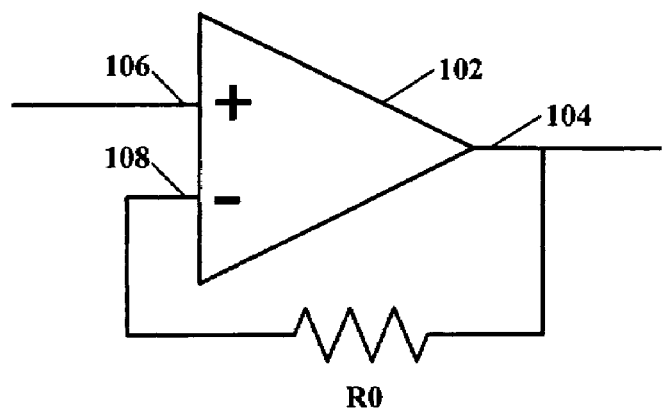
FIG. 1 illustrates a schematic diagram of a prior art non-inverting operational amplifier having a voltage gain of one.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

A selectable gain amplifier in a standard integrated circuit package configuration comprises an operational amplifier having an analog input, an output and a gain control input for selecting one of two or three possible gains for the operational amplifier. A plurality of selectable gain amplifiers in a standard integrated circuit package configuration, each having a gain control input for selection of the two or three possible gains, is also contemplated herein. The gain control input may replace an inverting input of a standard operational amplifier and the analog input may be a non-inverting input of the operational amplifier. All other characteristics of the selectable gain amplifier may be the same or similar to a standard operational amplifier. It is also contemplated herein that the inverting input may be used as the analog input and what would have been the non-inverting input used as a control input.

One of three gains may be selected through the control input by applying a positive supply voltage (e.g., logic level high), a common or ground supply voltage (e.g., logic level low) and no connection or a high impedance connection (e.g., floating input). One of these three input levels may be selected by a hardwired jumper or printed circuit board land, or by a tri-state output from a digital logic circuit, e.g., each of the three gains may be selected dynamically through software and/or firmware from an output of a digital logic device or circuit, e.g., a digital processor, microcontroller, microprocessor, application specific integrated circuit (ASIC), programmable logic array (PLA), digital signal processor (DSP), and the like.

One of two gains may be selected through the gain control input by applying a positive supply voltage (e.g., logic level high) or a common or ground supply voltage (e.g., logic level low) thereto. The one of two gains may be selected through the gain control input by applying either a positive supply voltage (e.g., logic level high) or a common or ground supply voltage (e.g., logic level low), or no connection to the gain control input. Thus, a voltage or current source or sink at the gain control input selects a first gain and no connection, e.g., substantially an open circuit may select a second gain. The one of two gains may be selected by logic level outputs from a digital logic circuit, e.g., a digital processor, microcontroller, microprocessor, application specific integrated circuit (ASIC), programmable logic array (PLA), digital signal processor (DSP), and the like.

The selectable gain amplifier(s) may be packaged in industry standard integrated circuit packages having standard pin-outs so that they may be compatible as replacement analog devices for the existing technology operational amplifier integrated circuit packages. The industry standard integrated circuit packages may be, for example but not limited to, DIP, QSOP, SIP, PGA, SSOP, PLCC, SOIC, TQFP, PAKs, SOT-23, SC-70, BGA: Ball Grid Array, BQFP: Bumpered Quad Flat Pack, CBGA: Ceramic Ball Grid Array, CFP: Ceramic Flat Pack, CPGA: Ceramic Pin Grid Array, CQFP: Ceramic Quad Flat Pack, TBD: Ceramic Lead-Less Chip Carrier, TBD: Dual Lead-Less Chip Carrier (Ceramic); FBGA: Fine-pitch Ball Grid Array, fpBGA: Fine Pitch Ball Grid Array, JLCC: J-Leaded Chip Carrier (Ceramic), LCC: Leaded Chip Carrier, LCCC: Leaded Ceramic Chip Carrier, PLCC: Plastic Leaded Chip Carrier, PQFD and PQFP: Plastic Quad Flat Pack, QSOP: Quarter Size Outline Package, SOIC: Small Outline IC, SSOP: Shrink Small-Outline Package, TQFP: Thin Quad Flat Pack, TSOP: Thin Small-Outline Package, TSSOP: Thin Shrink Small-Outline Package, TVSOP: Thin Very Small-Outline Package, and VQFB: Very-thin Quad Flat Pack.

Referring now to the drawings, the details of exemplary embodiments of the invention are schematically illustrated. Like elements in the drawing will be represented by like numbers, and similar elements will be represented by like numbers with a different lower case letter suffix.

Referring to FIG. 1, depicted is a schematic diagram of a prior art non-inverting operational amplifier having a voltage gain of one. An operational amplifier 102 is connected in an non-inverting configuration having an amplification of one. A resistor R0 is connected between the output 104 and the inverting input 108. The value of resistor R0 is arbitrary and may be chosen to equal the source resistance connected to the non-inverting input 106, or the resistor R0 may be substantially a conductor between the output 104 and the input 108.

Figure 2:
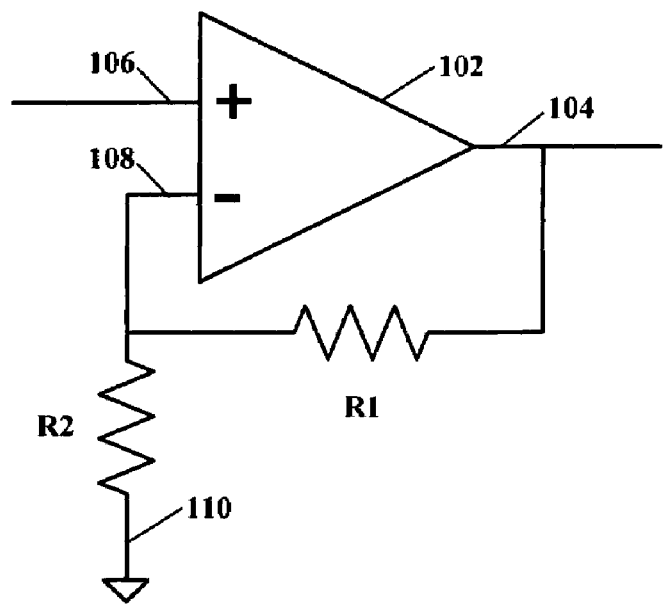
FIG. 2 illustrates a schematic diagram of a prior art non-inverting operational amplifier having a voltage gain of greater than one.

Referring to FIG. 2, depicted is a schematic diagram of a prior art non-inverting operational amplifier having a voltage gain of greater than one. An operational amplifier 102 is connected in an non-inverting configuration having amplification, A, determined by resistor R1 and resistor R2, i.e., $A=1+(R1/R2)$. The resistor R1 is connected between the output 104 and the inverting input 108. Resistor R2 is connected between the inverting input 108 and a circuit common 110. Two discrete resistors are required in addition to the operational amplifier.

Figure 3:
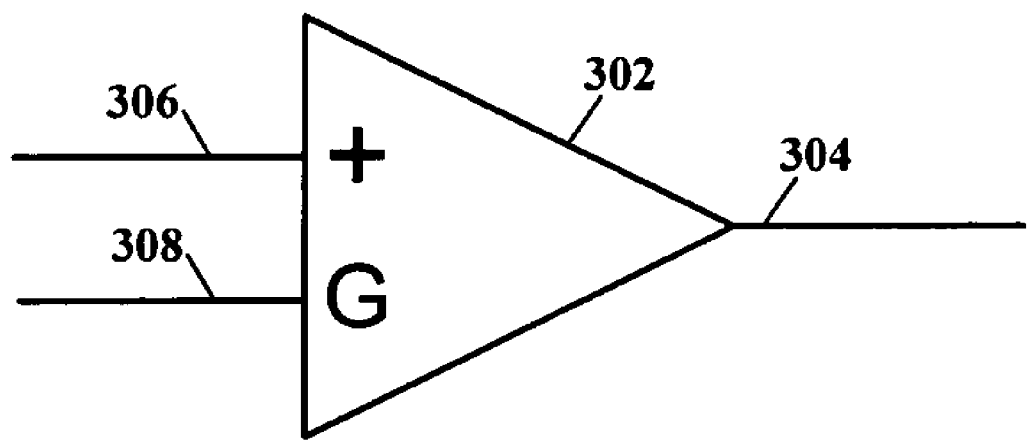
FIG. 3 illustrates a schematic diagram of a specific embodiment of a selectable gain amplifier.

Referring to FIG. 3, depicted is a schematic diagram of a specific embodiment of a selectable gain amplifier. A selectable gain amplifier 302 comprises an output 304, a non-inverting input 306 and a gain control input 308. The gain control input 308 may be used to select one of three gains at which the amplifier 302 will operate. Selecting one of three gains with one input 308 may be accomplished by connecting the gain control input 308 to a common voltage, e.g., grounding or logic low, for a first gain; to positive supply voltage, e.g., $V_{CC}$, $V_{DD}$, or logic high, for a second gain; and no connection, e.g., floating input, for a third gain. The three selectable gains may be configured for any three values and are correlated to three different control voltage levels at the gain control input 308. For example the first gain may be 10, the second gain may be 50 and the third gain may be one (1). Any other three different gains may be used and are contemplated herein.

Figure 4A:
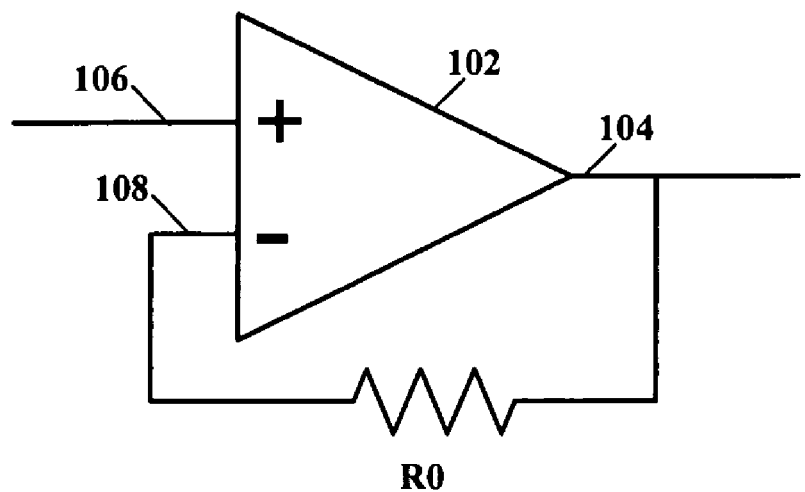
FIGS. 4A and 4B illustrate schematic circuit diagrams of a prior art non-inverting operational amplifier and a specific example embodiment of a selectable gain amplifier according to this disclosure, respectively, having voltage gains of one.
Figure 4B:
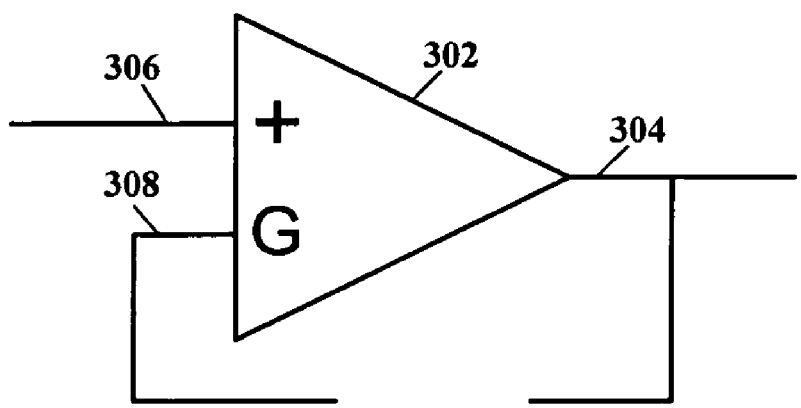

Referring to FIGS. 4a and 4b, depicted are schematic circuit diagrams of a prior art non-inverting operational amplifier and a selectable gain amplifier, respectively, having voltage gains of one. FIG. 4a shows the circuit connections required to configure the operational amplifier 102 to have a gain of one. FIG. 4b shows the selectable gain amplifier 302 configured for the third gain. For this example the third gain may be defined as one within the amplifier 302. Thus, the selectable gain amplifier 302 may be used with existing printed circuit boards by just leaving the resistor R0 off of the printed circuit board.

Figure 5A:
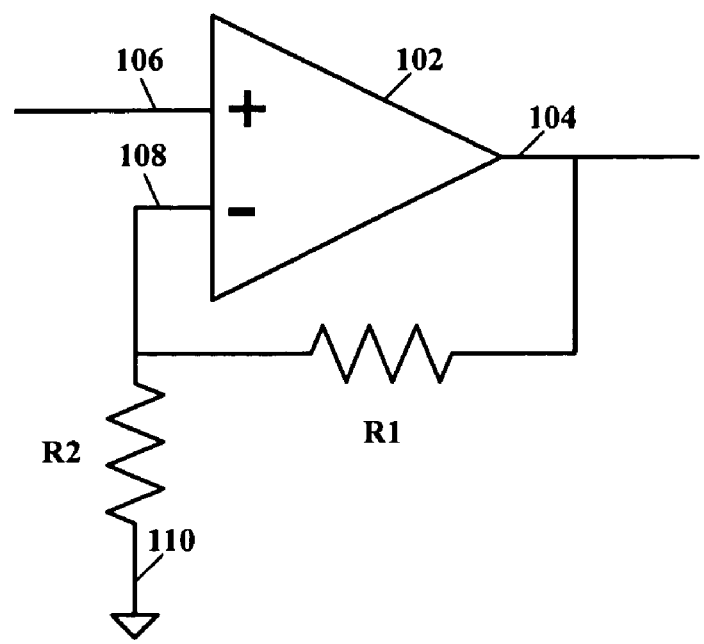
FIGS. 5A and 5B illustrate schematic circuit diagrams of a prior art non-inverting operational amplifier and a specific example embodiment of selectable gain amplifier according to this disclosure, respectively, having voltage gains of A.
Figure 5B:
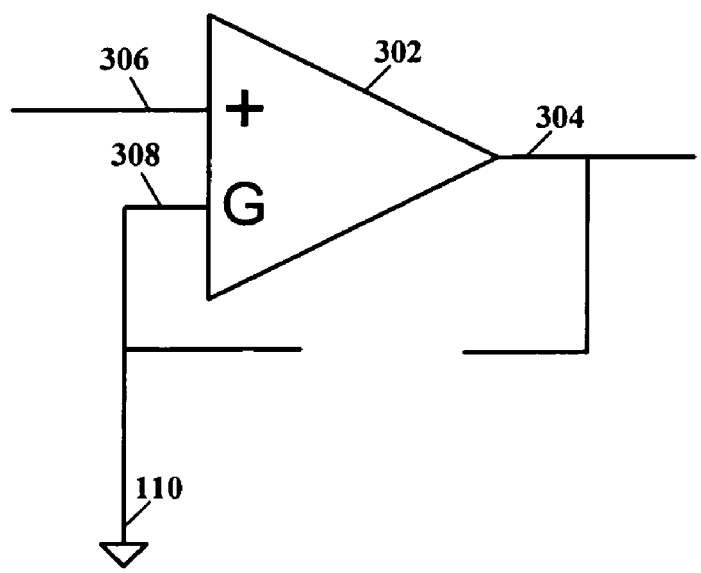

Referring to FIGS. 5a and 5b, depicted are schematic circuit diagrams of a prior art non-inverting operational amplifier and a selectable gain amplifier, respectively, having voltage gains of A. FIG. 5a shows the circuit connections required to configure the operational amplifier 102 to have a gain of A. FIG. 5b shows the selectable gain amplifier 302 configured for the second gain. For this example the second gain may be defined as A within the amplifier 302. Thus, the selectable gain amplifier 302 may be used with existing printed circuit boards by just leaving resistors R1 and R2 off of the printed circuit board and put a jumper or conductive bridge in place of resister R2.

Figure 6A:
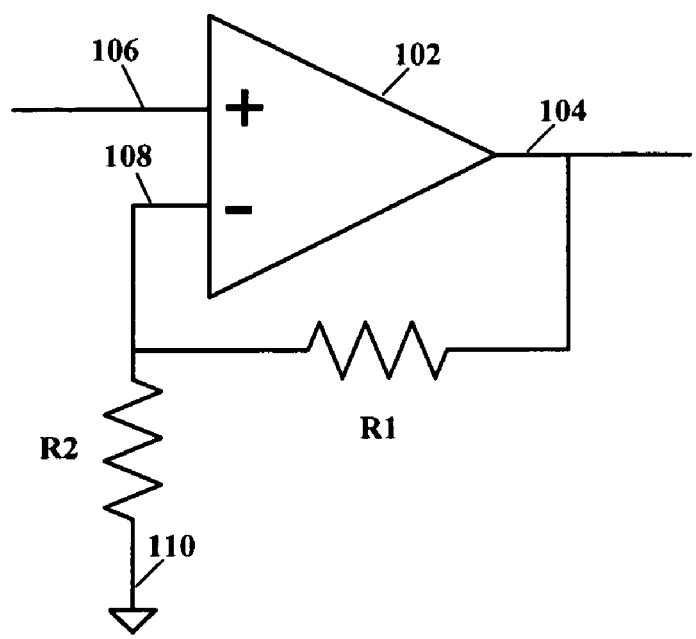
FIGS. 6A and 6B illustrate schematic circuit diagrams of a prior art non-inverting operational amplifier and a specific example embodiment of a selectable gain amplifier according to this disclosure, respectively, having voltage gains of B.
Figure 6B:
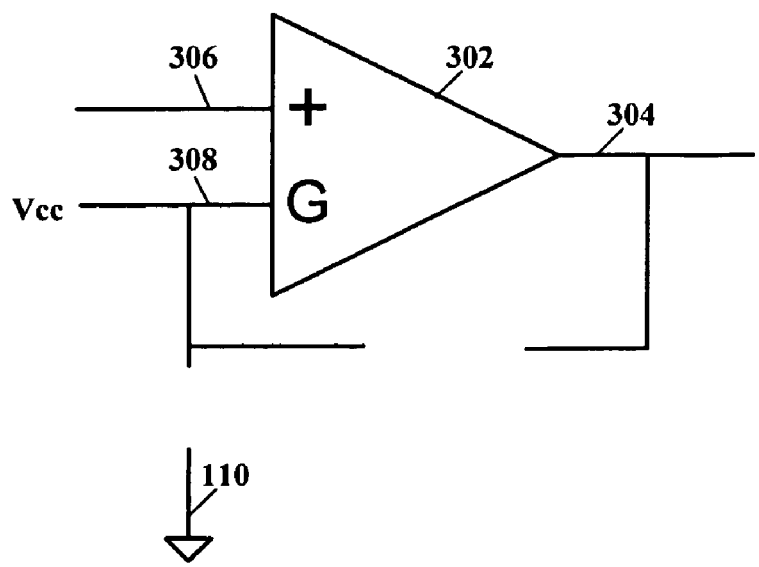

Referring to FIGS. 6a and 6b, depicted are schematic circuit diagrams of a prior art non-inverting operational amplifier and a selectable gain amplifier, respectively, having voltage gains of B. FIG. 6a shows the circuit connections required to configure the operational amplifier 102 to have a gain of B. FIG. 6b shows the selectable gain amplifier 302 configured for the first gain. For this example the first gain may be defined as B within the amplifier 302. Thus, the selectable gain amplifier 302 may be used with existing printed circuit boards by just leaving resistors R1 and R2 off of the printed circuit board and applying Vcc, Vdd, or logic high to the G input 308.

Figure 7:
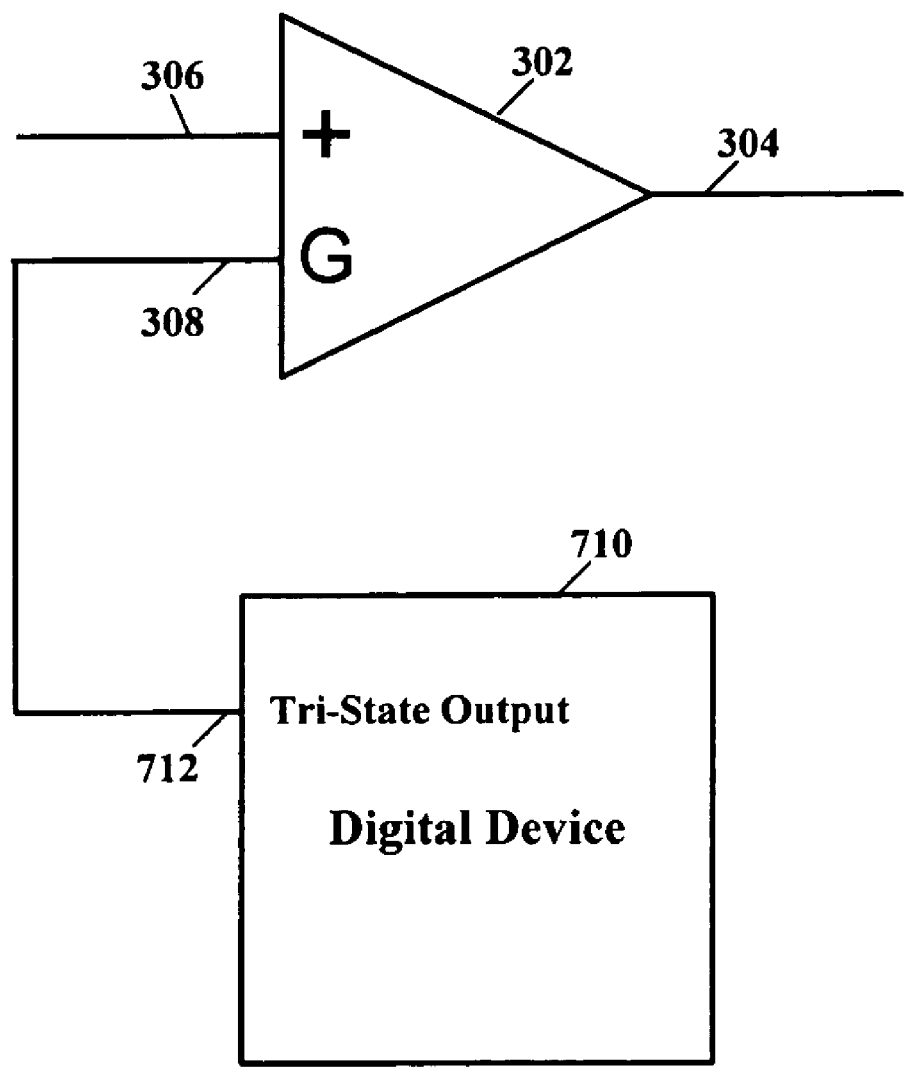
FIG. 7 illustrates a schematic circuit diagram of another specific embodiment of a selectable gain amplifier having a voltage gain controlled by a digital device.
Figure 8A:
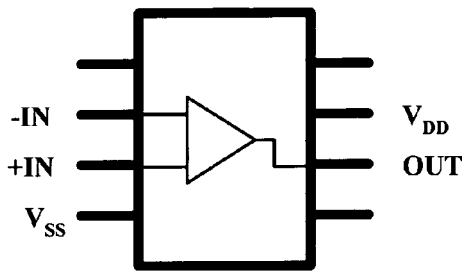
FIGS. 8A, 8C and 8E illustrate schematic integrated circuit package pin-out diagrams of various package configurations of prior art operational amplifiers.
Figure 8B:
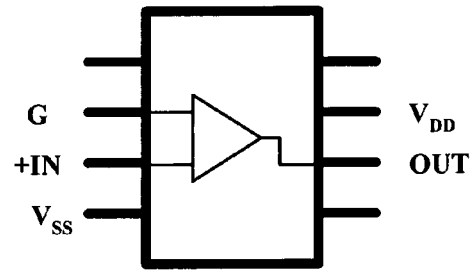
FIGS. 8B, 8D and 8F illustrate schematic integrated circuit package pin-out diagrams of corresponding package configurations of specific example embodiments of selectable gain amplifiers according to this disclosure.
Figure 8C:
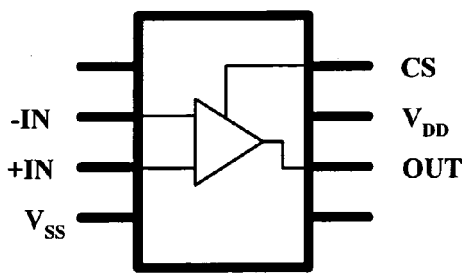
Figure 8D:
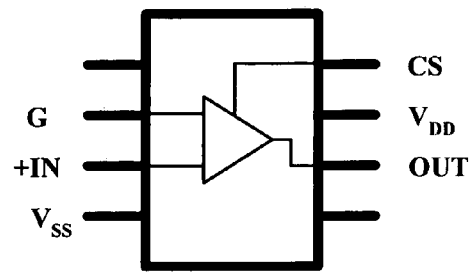
Figure 8E:
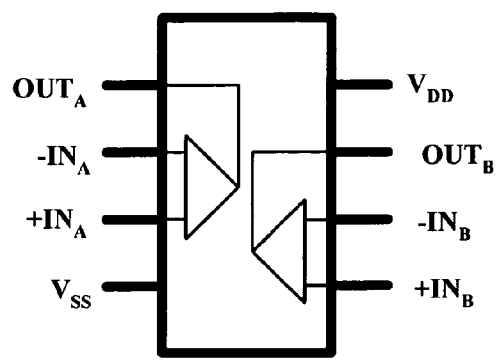
Figure 8F:
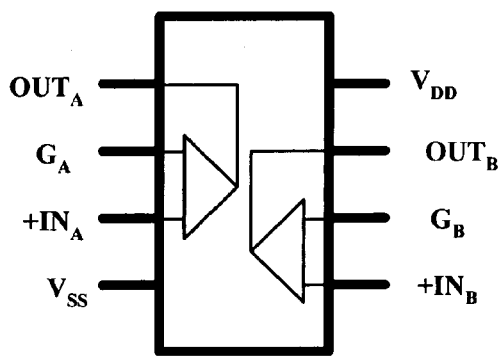

Referring to FIG. 7, depicted is a schematic circuit diagram of another specific embodiment of a selectable gain amplifier having a voltage gain controlled by a digital device. The gain control input 308 of the selectable gain amplifier 302 is coupled to a digital device 710. The digital device 710 drives the gain control input 308, for example but not limited to, with a output 712 that is tri-state. However, any type output 712 that can drive a load to a logic high, logic low and be put into a high impedance may be used in this specific embodiment. For example, a first gain may be selected by logic low, a second gain may be selected by logic high, and a third gain selected by a high impedance, e.g., output 712 disconnected. The three selectable gains may be configured for any three values and are correlated to the two different logic levels and the high impedance at gain control input 308. The digital device may be, for example but not limited to, a digital processor, microcontroller, microprocessor, application specific integrated circuit (ASIC), programmable logic array (PLA), and digital signal processor (DSP). The selectable gain amplifier and digital device may be enclosed in an integrated circuit and used in a mixed signal (both analog and digital) system.

Referring to FIG. 8, depicted is a schematic integrated circuit package pin-out diagrams of prior art operational amplifiers and corresponding selectable gain amplifiers. Standard pin-out integrated circuit packages may be used to package the selectable gain amplifier(s). As shown in FIG. 8, what used to be the –IN pins of the prior art packages are now gain control inputs, G, for the specific embodiments described herein. By using these standard integrated circuit packages and pin-outs with the selectable gain amplifier(s) as described herein, existing printed circuit board designs may be retained and a reduction of components (resistors) realized.

Figure 9A:
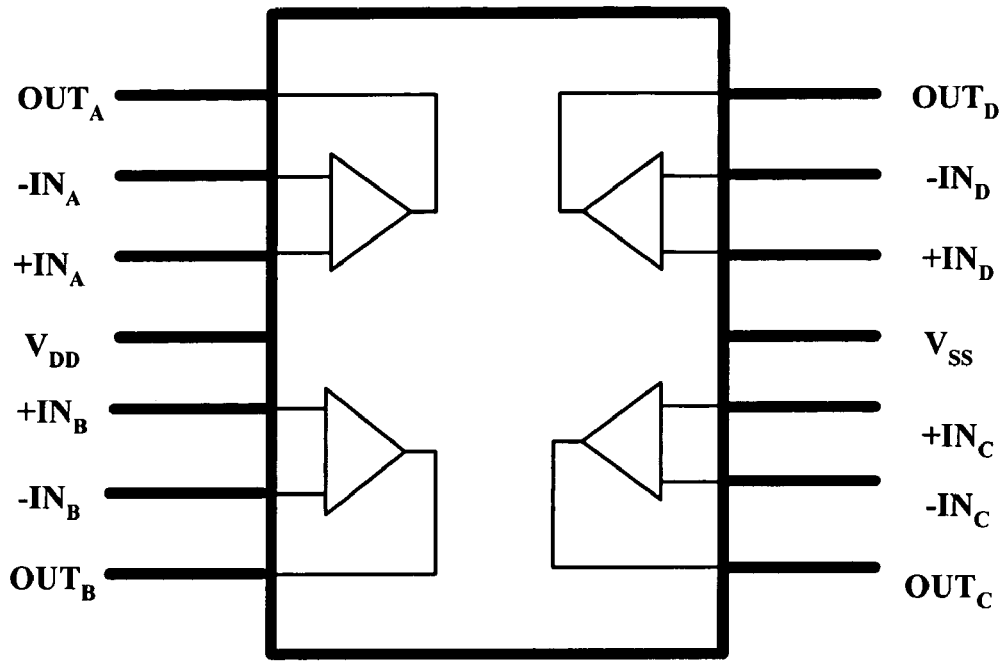
FIGS. 9A and 9B illustrates schematic integrated circuit package pin-out diagrams of a prior art quad operational amplifiers and a specific example embodiment of a corresponding selectable gain amplifiers according to this disclosure, respectively.
Figure 9B:
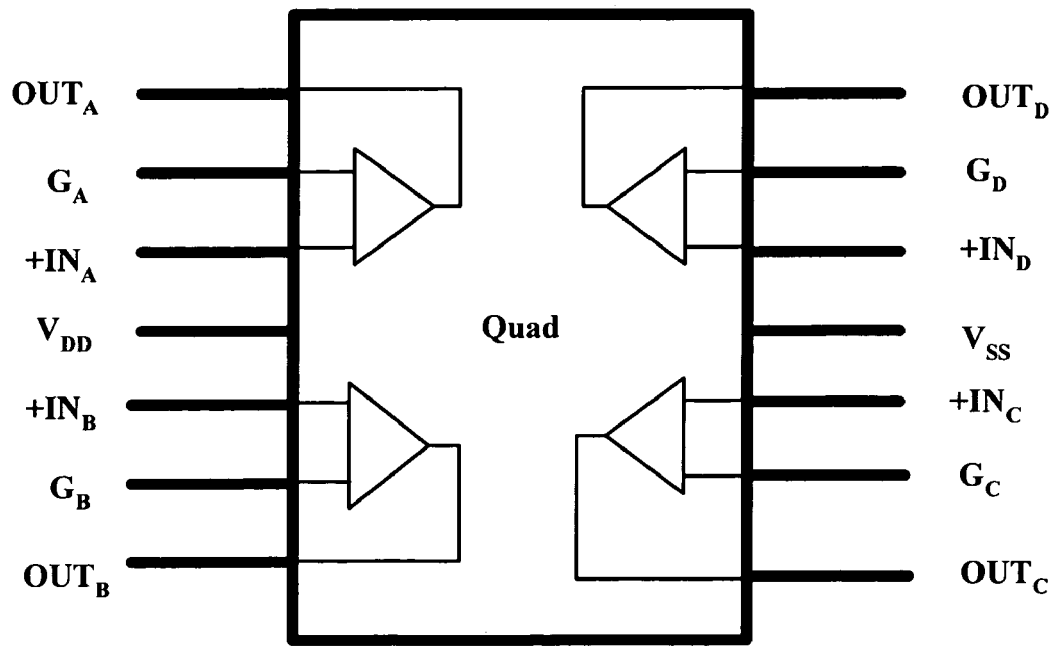
Figure 10A:
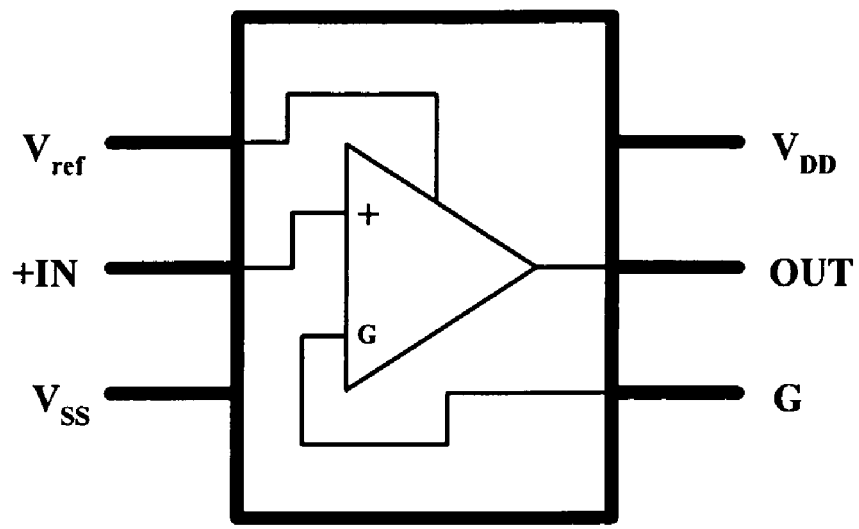
FIGS. 10A and 10B illustrate other specific example embodiments of selectable gain amplifier integrated circuit packaging according to this disclosure.
Figure 10B:
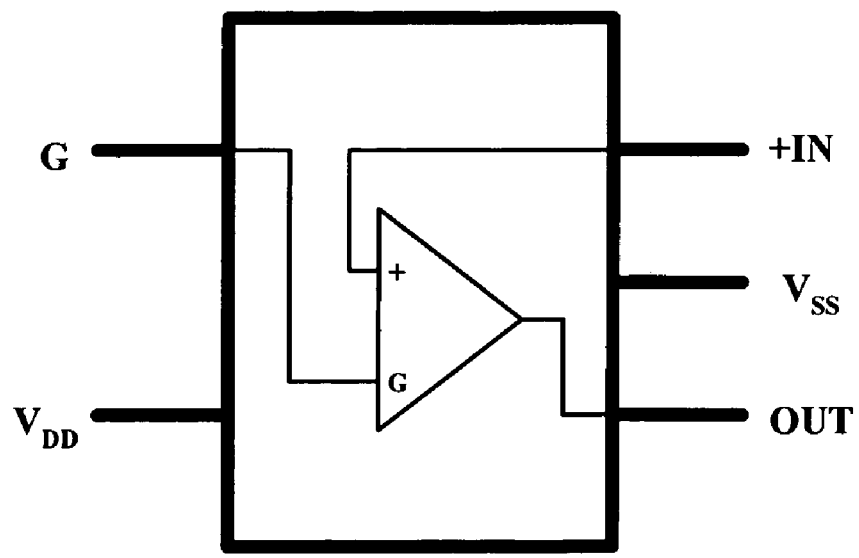

Referring to FIG. 9, depicted is a schematic integrated circuit package pin-out diagrams of a prior art quad operational amplifiers and corresponding selectable gain amplifiers, and other specific embodiments of selectable gain amplifier integrated circuit packaging. As shown in FIG. 9, what used to be the –IN pins of the prior art packages are now gain control inputs, G, for the specific embodiments described herein. By using these standard integrated circuit packages and pin-outs with the selectable gain amplifier(s) as described herein, existing printed circuit board designs may be retained and a reduction of components (resistors) realized.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A selectable gain analog amplifier of an integrated circuit, comprising:
  an integrated circuit amplifier having an analog output, an analog input and a gain control input, wherein the integrated circuit amplifier has a first gain, a second gain and a third gain selected by a first input value, a second input value and a third input value, respectively, on the gain control input; and
  an integrated circuit package, the integrated circuit package enclosing the integrated circuit amplifier and havinig the same pin-outs as a standard operational amplifier integrated circuit package, wherein an invertinig input of the standard operational amplifier integrated circuit package is replaced by the gain control input.

2. The selectable gain analog amplifier of claim 1, wherein the integrated circuit amplifier is an operational amplifier.

3. The selectable gain analog amplifier of claim 1, wherein the first, second and third input values are selected from the group consisting of a first voltage, a second voltage and a high impedance.

4. The selectable gain analog amplifier claim 3, wherein the first voltage is at a common low voltage.

5. The selectable gain analog amplifier claim 4, wherein the common low voltage is at substantially ground potential.

6. The selectable gain analog amplifier of claim 3, wherein the second voltage is at a positive voltage.

7. The selectable gain analog amplifier of claim 3, wherein the high impedance is a high resistance.

8. The selectable gain analog amplifier of claim 3, wherein the high impedance is an open circuit.

9. The selectable gain analog amplifier of claim 1, further comprising a plurality of integrated circuit amplifiers, wherein the integrated circuit package encloses the plurality of integrated circuit amplifiers, and each one of the plurality of integrated circuit amplifiers having an analog output, an analog input and a gain control input.

10. The selectable gain analog amplifier of claim 1, further comprising a digital device having an output coupled to the gain control input, wherein the digital device output supplies the first input value, the second input value and the third input value.

11. The selectable gain analog amplifier of claim 10, wherein the output of the digital device has a logic high, a logic low and a high impedance.

12. The selectable gain analog amplifier of claim 10, wherein the digital device is selected from the group consisting of a digital processor, microcontroller, microprocessor, application specific integrated circuit (ASIC), programmable logic array (PLA), and digital signal processor (DSP).

13. The selectable gain analog amplifier of claim 1, wherein the integrated circuit package is a standard operational amplifier integrated circuit package enclosing the integrated circuit amplifier.

14. The selectable gain analog amplifier of claim 13, wherein the standard integrated circuit package is selected from the group consisting of DIP, QSOP, SIP, PGA, SSOP, PLCC, SOIC, TQFP, PAKs, SOT-23, SC-70, BGA: Ball Grid Array, BQFP: Bumpered Quad Flat Pack, CBGA: Ceramic Ball Grid Array, CFP: Ceramic Flat Pack, CPGA: Ceramic Pin Grid Array, CQFP: Ceramic Quad Flat Pack, TBD: Ceramic Lead-Less Chip Carrier, TBD: Dual Lead-Less Chip Carrier (Ceramic); FBGA: Fine-pitch Ball Grid Array, fpBGA: Fine Pitch Ball Grid Array, JLCC: J-Leaded Chip Carrier (Ceramic), LCC: Leaded Chip Carrier, LCCC: Leaded Ceramic Chip Carrier, PLCC: Plastic Leaded Chip Carrier, PQFD and PQFP: Plastic Quad Flat Pack, QSOP: Quarter Size Outline Package, SOIC: Small Outline IC, SSOP: Shrink Small-Outline Package, TQFP: Thin Quad Flat Pack, TSOP: Thin Small-Outline Package, TSSOP: Thin Shrink Small-Outline Package, TVSOP: Thin Very Small-Outline Package, and VQFB: Very-thin Quad Flat Pack.

15. The selectable gain analog amplifier of claim 1, wherein the first gain is about 10, the second gain is about 50, and the third gain is about one (1).

16. The selectable gain analog amplifier of claim 1, wherein the first, second and third gains are selected from the group consisting of positive integer values.

17. The selectable gain analog amplifier of claim 9, wherein the plurality of integrated circuit amplifiers are enclosed in the integrated circuit package having the same pin-outs as a standard multiple operational amplifier integrated circuit package, wherein inverting inputs of the standard multiple operational amplifier integrated circuit package are replaced by gain control inputs for each of the plurality of integrated circuit amplifiers.

18. An integrated circuit, comprising:
at least one analog amplifier having an analog output, an analog input and a gain control input, wherein the at least one analog amplifier has a first gain, a second gain and a third gain selected by a first input value, a second input value and a third input value, respectively, on the gain control input; and
an integrated circuit package enclosing the at least one analog amplifier, wherein signal and power pin-outs of the integrated circuit package substantially match an industry standard analog amplifier integrated circuit package and the gain control input replaces an inverting input of the industry standard analog amplifier integrated circuit package.

19. The integrated circuit of claim 18, further comprising:
a digital device having an output coupled to the gain control input, wherein the digital device output supplies the first input value, the second input value and the third input value; and
the integrated circuit package enclosing the at least one analog amplifier and the digital device.

20. The integrated circuit of claim 18, wherein the first, second and third input values are selected from the group consisting of a first voltage, a second voltage and a high impedance.

21. The integrated circuit of claim 19, wherein the digital device is selected from the group consisting of a digital processor, microcontroller, microprocessor, application specific integrated circuit (ASIC), programmable logic array (PLA), and digital signal processor (DSP).

22. The integrated circuit of claim 18, wherein the integrated circuit package is selected from the group consisting of DIP, QSOP, SIP, PGA, SSOP, PLCC, SOIC, TQFP, PAKs, SOT-23, SC-70, BGA: Ball Grid Array, BQFP: Bumpered Quad Flat Pack, CBGA: Ceramic Ball Grid Array, CFP: Ceramic Flat Pack, CPGA: Ceramic Pin Grid Array, CQFP: Ceramic Quad Flat Pack, TBD: Ceramic Lead-Less Chip Carrier, TBD: Dual Lead-Less Chip Carrier (Ceramic); FBGA: Fine-pitch Ball Grid Array, fpBGA: Fine Pitch Ball Grid Array, JLCC: J-Leaded Chip Carrier (Ceramic), LCC: Leaded Chip Carrier, LCCC: Leaded Ceramic Chip Carrier, PLCC: Plastic Leaded Chip Carrier, PQFD and PQFP: Plastic Quad Flat Pack, QSOP: Quarter Size Outline Package, SOIC: Small Outline IC, SSOP: Shrink Small-Outline Package, TQFP: Thin Quad Flat Pack, TSOP: Thin Small-Outline Package, TSSOP: Thin Shrink Small-Outline Package, TVSOP: Thin Very Small-Outline Package, and VQFB: Very-thin Quad Flat Pack.

23. A selectable gain analog amplifier of an integrated circuit, comprising:
an integrated circuit amplifier having an analog output, an analog input and a gain control input, wherein the integrated circuit amplifier has a first gain and a second gain selected by a first input value and a second input value, respectively, on the gain control input; and
an integrated circuit package, the integrated circuit package enclosing the integrated circuit amplifier and having the same pin-outs as a standard operational amplifier integrated circuit package, wherein an invertinig input of the standard operational amplifier integrated circuit package is replaced by the gain control input.

24. The selectable gain analog amplifier of claim 23, wherein the integrated circuit amplifier is an operational amplifier.

25. The selectable gain analog amplifier of claim 23, wherein the first and second input values are selected from the group consisting of a first voltage, a second voltage and a high impedance.

26. The selectable gain analog amplifier claim 25, wherein the first voltage is at a common low voltage.

27. The selectable gain analog amplifier claim 26, wherein the common low voltage is at substantially ground potential.

28. The selectable gain analog amplifier of claim 25, wherein the second voltage is at a positive voltage.

29. The selectable gain analog amplifier of claim 25, wherein the high impedance is a high resistance.

30. The selectable gain analog amplifier of claim 25, wherein the high impedance is an open circuit.

31. The selectable gain analog amplifier of claim 23, further comprising a plurality of integrated circuit amplifiers, wherein the integrated circuit package encloses the plurality of integrated circuit amplifiers, and each one of the plurality of integrated circuit amplifiers having an analog output, an analog input and a gain control input.

32. The selectable gain analog amplifier of claim 23, further comprising a digital device having an output coupled to the gain control input, wherein the digital device output supplies the first input value and the second input value.

33. The selectable gain analog amplifier of claim 32, wherein the digital device has an output capable of being at a logic high or a logic low.

34. The selectable gain analog amplifier of claim 32, wherein the digital device is selected from the group consisting of a digital processor, microcontroller, microprocessor, application specific integrated circuit (ASIC), programmable logic array (PLA), and digital signal processor (DSP).

35. The selectable gain analog amplifier of claim 23, wherein the integrated circuit package is a standard operational amplifier integrated circuit package enclosing the integrated circuit amplifier.

36. The selectable gain analog amplifier of claim 35, wherein the standard integrated circuit package is selected from the group consisting of DIP, QSOP, SIP, PGA, SSOP, PLCC, SOIC, TQFP, PAKs, SOT-227, SC-70, BGA: Ball Grid Array, BQFP: Bumpered Quad Flat Pack, CBGA: Ceramic Ball Grid Array, CFP: Ceramic Flat Pack, CPGA: Ceramic Pin Grid Array, CQFP: Ceramic Quad Flat Pack, TBD: Ceramic Lead-Less Chip Carrier, TBD: Dual Lead-Less Chip Carrier (Ceramic); FBGA: Fine-pitch Ball Grid Array, fpBGA: Fine Pitch Ball Grid Array, JLCC: J-Leaded Chip Carrier (Ceramic), LCC: Leaded Chip Carrier, LCCC: Leaded Ceramic Chip Carrier, PLCC: Plastic Leaded Chip Carrier, PQFD and PQFP: Plastic Quad Flat Pack, QSOP: Quarter Size Outline Package, SOIC: Small Outline IC, SSOP: Shrink Small-Outline Package, TQFP: Thin Quad Flat Pack, TSOP: Thin Small-Outline Package, TSSOP: Thin Shrink Small-Outline Package, TVSOP: Thin Very Small-Outline Package, and VQFB: Very-thin Quad Flat Pack.

37. The selectable gain analog amplifier of claim 23, wherein the first gain is about 10, and the second gain is about 50.

38. The selectable gain analog amplifier of claim 23, wherein the first and second gains are selected from the group consisting of positive integer values.

39. The selectable gain analog amplifier of claim 31, wherein the plurality of integrated circuit amplifiers are enclosed in the integrated circuit package having the same pin-outs as a standard multiple operational amplifier integrated circuit package, wherein inverting inputs of the standard multiple operational amplifier integrated circuit package are replaced by gain control inputs for each of the plurality of integrated circuit amplifiers.

* * * * *